United States Patent
Son et al.

(10) Patent No.: US 12,477,715 B2
(45) Date of Patent: Nov. 18, 2025

(54) SEMICONDUCTOR DEVICE

(71) Applicant: Samsung Electronics Co., Ltd., Suwon-si (KR)

(72) Inventors: Jihye Son, Suwon-si (KR); Hojoong Kim, Suwon-si (KR); Youngsin Kim, Suwon-si (KR); Hyo-Seok Kim, Suwon-si (KR); Bongsik Choi, Suwon-si (KR); Taewoong Koo, Suwon-si (KR); Taeha Suh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 17/936,960

(22) Filed: Sep. 30, 2022

(65) Prior Publication Data
US 2023/0328956 A1  Oct. 12, 2023

(30) Foreign Application Priority Data
Apr. 7, 2022  (KR) ................. 10-2022-0043588

(51) Int. Cl.
*H01L 23/29* (2006.01)
*H10B 12/00* (2023.01)

(52) U.S. Cl.
CPC ........... *H10B 12/09* (2023.02); *H10B 12/315* (2023.02); *H10B 12/34* (2023.02); *H10B 12/50* (2023.02)

(58) Field of Classification Search
CPC ...... H10B 12/09; H10B 12/315; H10B 12/34; H10B 12/50; H10B 12/053;
(Continued)

(56) References Cited

U.S. PATENT DOCUMENTS 7,071,105 B2   7/2006  Carter et al.
8,158,532 B2   4/2012  Mayer et al.
(Continued)

FOREIGN PATENT DOCUMENTS

| JP | 2004259753 A | * | 9/2004 |
|---|---|---|---|
| KR | 10-2014-0062601 A | | 5/2014 |
| KR | 101899948 B1 | | 9/2018 |

OTHER PUBLICATIONS

Kim, Sanha, et al., "The Role of Pad Topography in Chemical-Mechanical Polishing", IEEE Transactions on Semiconductor Manufacturing, vol. 27, No. 3, Aug. 2014, pp. 431-442.

*Primary Examiner* — Samuel Park
(74) *Attorney, Agent, or Firm* — Wolf, Greenfield & Sacks, P.C.

(57) ABSTRACT

A semiconductor device includes a substrate including a first active pattern having first and second source/drain regions of a cell region, a device isolation layer in a trench defining the first active pattern on the cell region, a buffer layer on the cell region, a line structure extends in a third direction, extends from the cell region to a boundary region, and including a first conductive pattern that passes through the buffer layer and contacts the first source/drain region, a bit line on the first conductive pattern, and a first barrier pattern between the bit line and the first conductive pattern, a pair of spacers respectively on both sidewalls of the line structure, a contact on the second source/drain region, a landing pad on the contact, a first abrasive particle between the contact and the landing pad, and a data storage element on the landing pad.

20 Claims, 18 Drawing Sheets

(58) Field of Classification Search
CPC ............... H10B 12/0335; H10B 12/01; H01L 21/76895; G11C 11/4097
See application file for complete search history.

(56) References Cited

U.S. PATENT DOCUMENTS

| | | |
|---|---|---|
| 8,840,798 B2 | 9/2014 | Han et al. |
| 10,319,601 B2 | 6/2019 | Arnepalli et al. |
| 11,034,861 B2 | 6/2021 | Mishra |
| 2006/0006142 A1 | 1/2006 | Takayasu et al. |
| 2015/0102504 A1* | 4/2015 | Park .................. H10B 12/488 257/776 |
| 2015/0284593 A1 | 10/2015 | Wang et al. |
| 2020/0243374 A1* | 7/2020 | Choi .................. H01L 21/3212 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No.10-2022-0043588, filed on Apr. 7, 2022, in the Korean Intellectual Property Office, the entire contents of which are hereby incorporated by reference.

BACKGROUND

The inventive concept is directed to a semiconductor device and a manufacturing method thereof, and more particularly, relates to a semiconductor memory device having improved reliability and a manufacturing method thereof.

A semiconductor device is in the spotlight as an important device in the electronics industry due to characteristics such as miniaturization, multifunctionality, and/or low manufacturing cost. Among semiconductor devices, a data storage element may store logic data. With the development of the electronics industry, the data storage element has become more highly integrated. Accordingly, critical dimensions of the device including the data storage element are reduced.

In addition, high reliability of the data storage element may be required along with high integration of the data storage element. However, due to high integration, the reliability of the data storage element may be deteriorated. Accordingly, many studies are being conducted to improve the reliability of the data storage element.

Meanwhile, for miniaturization and high integration of the data storage element, various methods of forming a microstructure such as a metal interconnect or a shallow trench isolation with widths of several nanometers is being studied. In forming the microstructure, a polishing process may be performed to make a flat surface of the microstructure. One of the polishing processes may be chemical mechanical polishing (CMP). The chemical mechanical polishing is a process of planarizing a surface of the substrate with pressing and rotating, which includes providing a polishing slurry containing abrasive particles between a polishing pad and a semiconductor substrate to be polished and contacting the semiconductor substrate with the polishing pad and rotating.

SUMMARY

Some embodiments of the inventive concept provide a semiconductor memory device with improved reliability and yield by minimizing a step difference between a core region, a peripheral region, and a cell region for miniaturization of the semiconductor device.

Some embodiments of the inventive concept provide a method of manufacturing a semiconductor memory device with improved reliability and yield by minimizing a step difference between a core region, a peripheral region, and a cell region for miniaturization of the semiconductor device.

According to some embodiments of the inventive concept, a semiconductor device may include a substrate including a first active pattern of a cell region, the first active pattern having a long axis in a first direction, the first active pattern having a first source/drain region and a second source/drain region spaced apart from each other in the first direction, a device isolation layer on the cell region, the device isolation layer in a trench defining the first active pattern, a buffer layer on the cell region, a line structure that extends through the first active pattern in a third direction crossing a second direction and the first direction on the buffer layer, the line structure extending from the cell region to a boundary region, the line structure including a first conductive pattern that passes through the buffer layer and contacts the first source/drain region, a bit line on the first conductive pattern, and a first barrier pattern between the bit line and the first conductive pattern, a pair of spacers respectively on both sidewalls of the line structure, a contact on the second source/drain region, a landing pad on the contact, a first abrasive particle between the contact and the landing pad, and a data storage element on the landing pad.

According to some embodiments of the inventive concept, a semiconductor device may include a substrate including a cell region, a core region, and a boundary region between the cell region and the core region, the cell region including a first active pattern, the core region including a second active pattern, a device isolation layer on the boundary region, the device isolation layer is in a trench between the first active pattern and the second active pattern, a line structure on the first active pattern and extending from the cell region to the boundary region, a core gate structure on the second active pattern, a mask pattern on the core gate structure, an insulating pattern on the mask pattern and a first abrasive particle between the mask pattern and the insulating pattern.

According to some embodiments of the inventive concept, a semiconductor device may include a substrate including a cell region, a core region, and a boundary region between the cell region and the core region, the cell region including a first active pattern, the core region including a second active pattern, a buffer layer on the cell region, a line structure on the buffer layer, the line structure including a conductive pattern, a barrier pattern, and a bit line sequentially stacked on a first source/drain region, a pair of spacers respectively on both sidewalls of the line structure, a contact connected to a second source/drain region on the first active pattern, a landing pad on the contact, a data storage element on the landing pad, a core gate structure on the second active pattern, a mask pattern on the core gate structure, and an insulating pattern on the mask pattern, and a step difference between a top surface of the mask pattern on the core region and a top surface of the contact on the cell region may be 1 nm to 5 nm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6 is a cross-sectional view of a structure to which FIG. 4 is applied.

DETAILED DESCRIPTION

Figure 1:
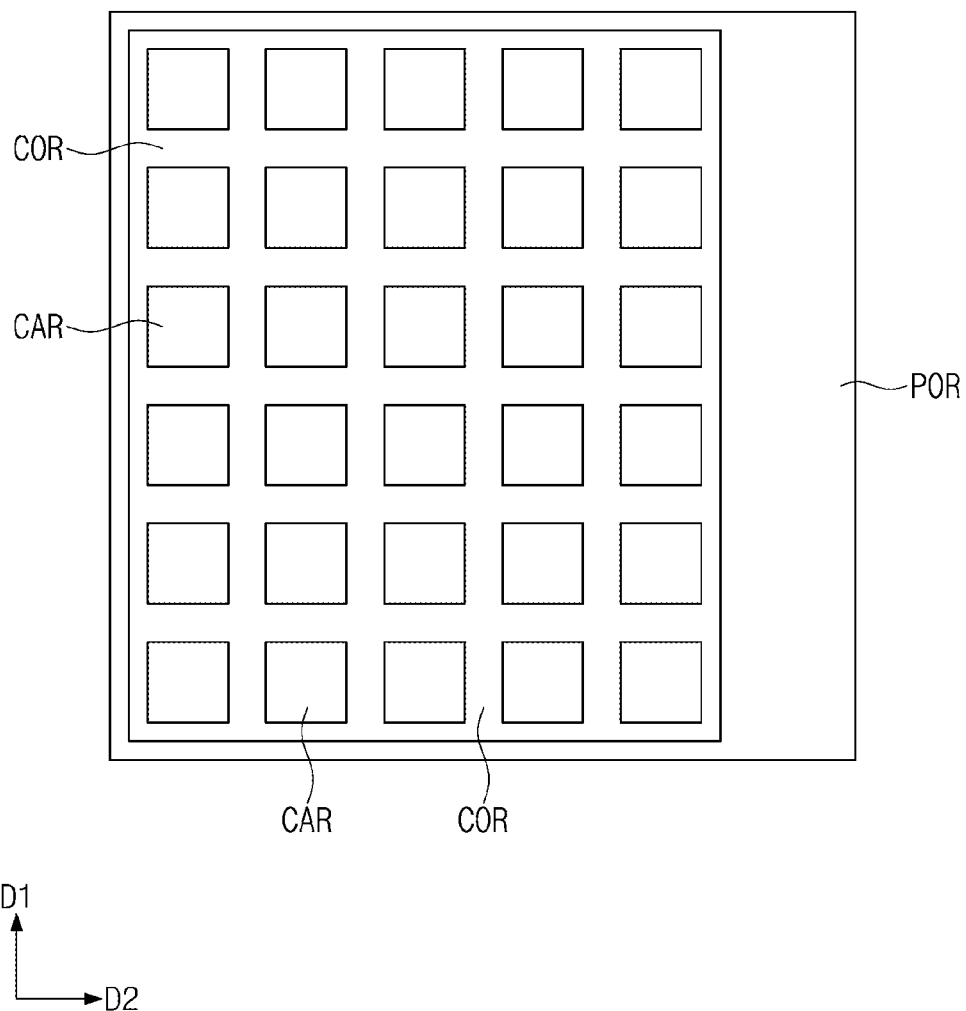
FIG. 1 is a plan view of a semiconductor device according to embodiments of the inventive concept.

In this specification, like reference numerals may refer to like elements throughout. A semiconductor device and a method for manufacturing the same according to the inventive concept will be described.

In order to fully understand the configuration and effects of the inventive concept, preferred embodiments of the inventive concept will be described in detail with reference to the accompanying drawings.

The inventive concept is not limited to the embodiments disclosed below, but may be implemented in various forms and subjected to various modifications and variations. However, through the description of the present embodiment, it is provided in order to complete the disclosure of the inventive concept and to fully inform those of ordinary skill in the art to which the inventive concept pertains to the scope of the inventive concept. In the accompanying drawings, for convenience of explanation, the components are enlarged than the actual size, the proportions of each component may be exaggerated or reduced.

The terminology used herein is for the purpose of describing the embodiments and is not intended to limit the inventive concept. Also, unless otherwise defined, terms used herein may be interpreted as meanings commonly known to those of ordinary skill in the art.

In this specification, the singular also includes the plural unless specifically stated otherwise in the phrase. As used herein, 'comprises' and/or 'comprising' does not exclude the presence or addition of one or more other components, steps, operations and/or elements other than the mentioned elements, steps, acts and/or elements.

When a layer is referred to herein as being 'on' another layer, it may be formed directly on top of another layer or with the other layer interposed therebetween.

In this specification, terms such as first, second, etc. are used to describe various regions, layers, and the like, but these regions, layers, and the like and should not be limited by these terms. These terms are only used to distinguish one region or layer from another. Accordingly, a part referred to as the first part in one embodiment may be referred to as the second part in other embodiments. The embodiments described and illustrated herein also include complementary embodiments thereof. Elements indicated with like reference numerals throughout the specification indicate like elements.

Hereinafter, embodiments of a semiconductor device and a method of manufacturing the same according to the inventive concept will be described in detail with reference to FIGS. 1 to 11.

FIG. 1 is a plan view of a semiconductor device according to embodiments of the inventive concept. A semiconductor device 10 may include cell regions CAR. The cell regions CAR may have areas including a plurality of memory cells, and may each include one unit cell block. The cell regions CAR may be spaced apart from one another in a first direction D1 and a second direction D2.

A core region COR may be provided between adjacent cell regions CAR. A sense amplifier and a write driver may be provided in the core region COR. A peripheral circuit region POR may be provided at one side of the cell regions CAR. The peripheral circuit region POR may include a row decoder and a column decoder.

Figure 2:
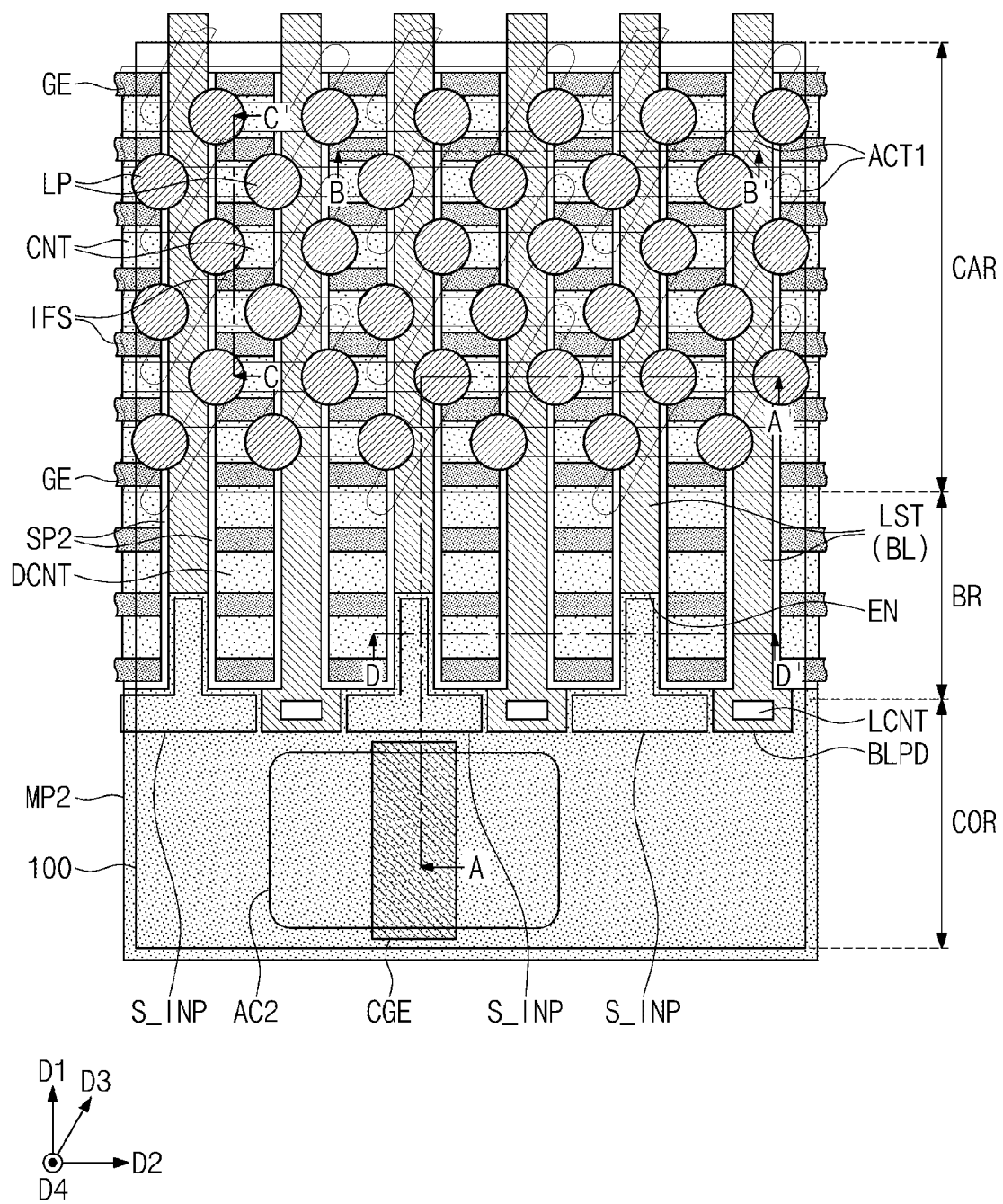
FIG. 2 is an enlarged plan view of a boundary between a cell region and a core region of FIG. 1.
Figure 3A:
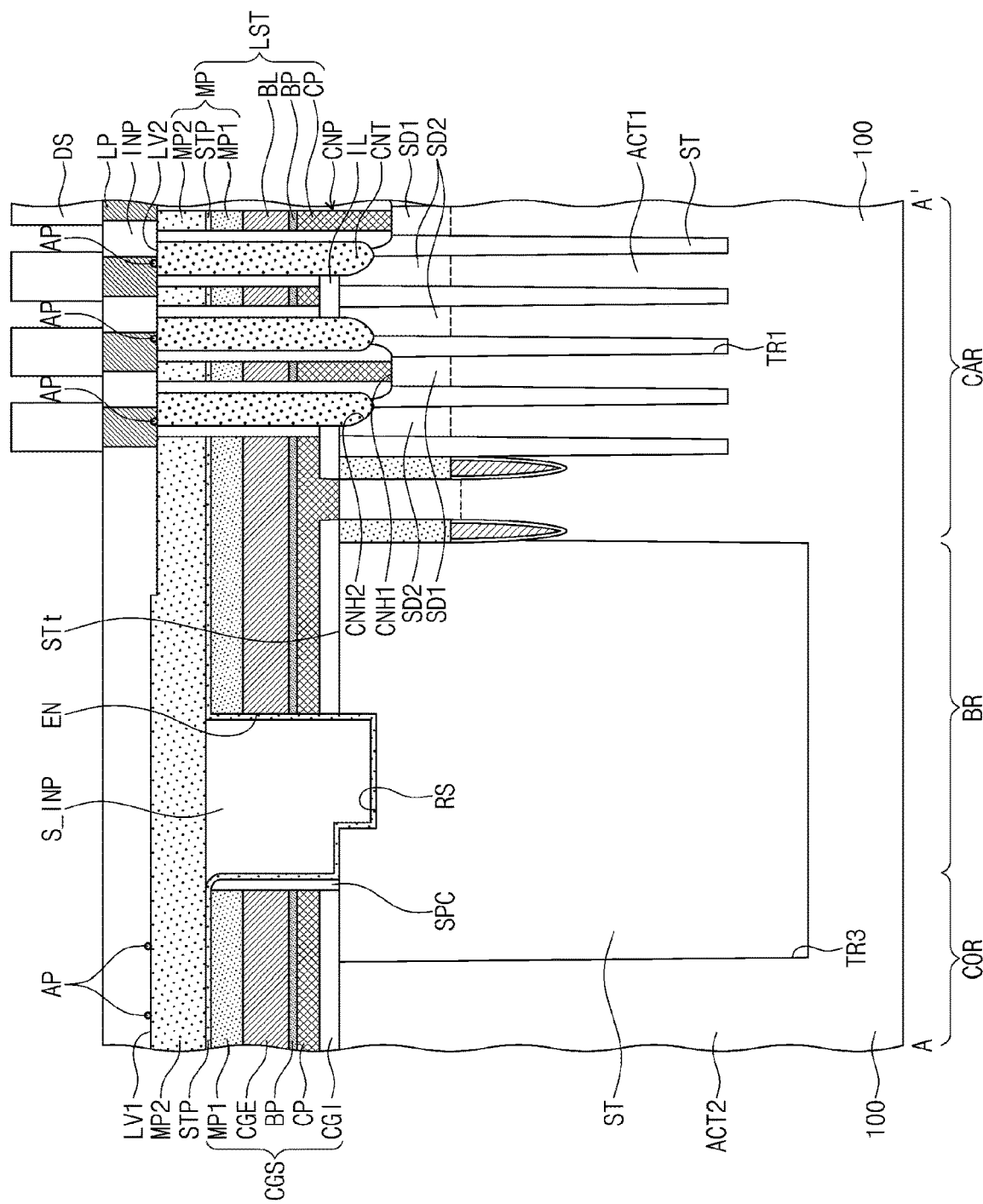
FIG. 3A is a cross-sectional view taken along line A-A' of FIG. 2.
Figure 3B:
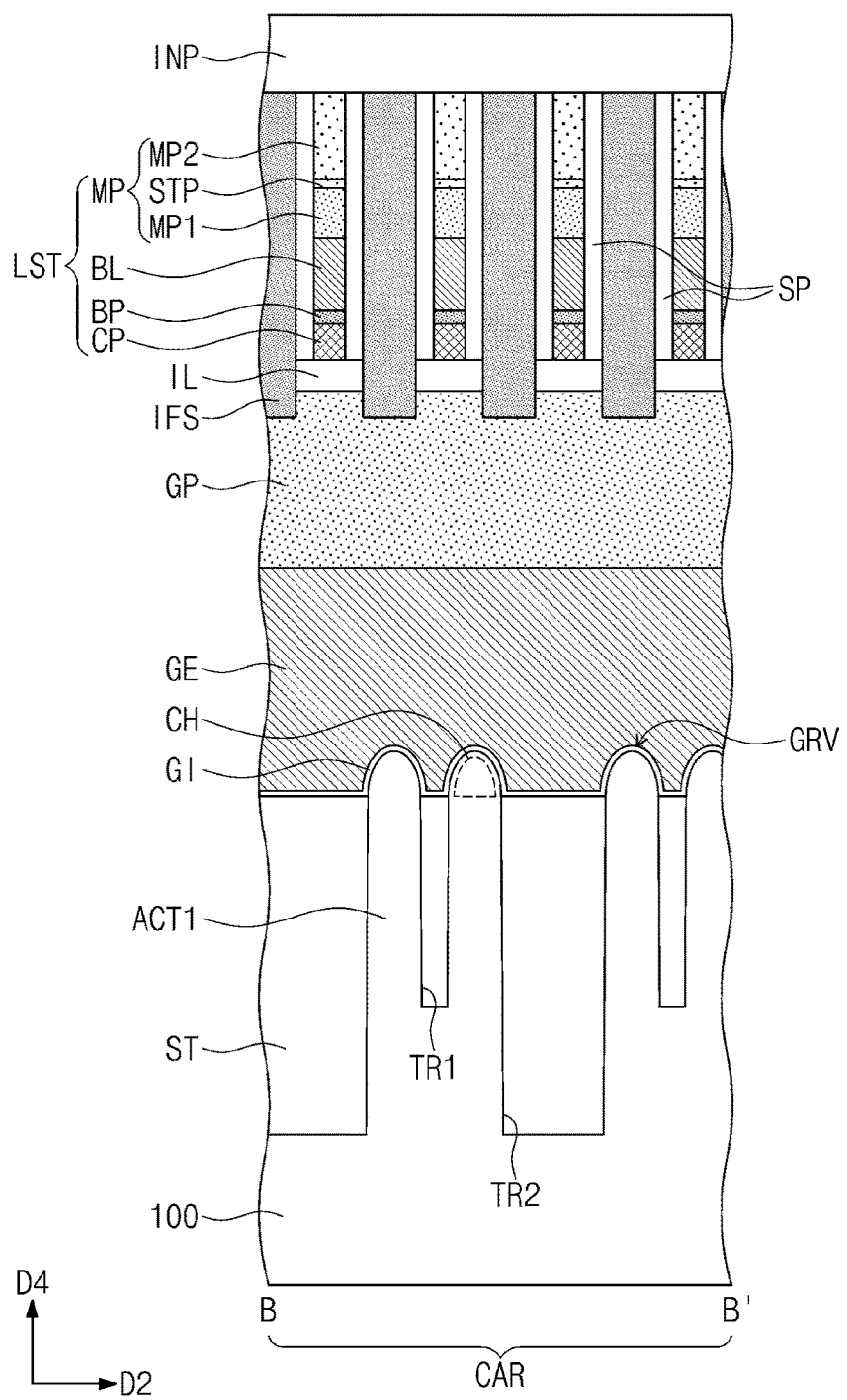
FIG. 3B is a cross-sectional view taken along line B-B' of FIG. 2.
Figure 3C:
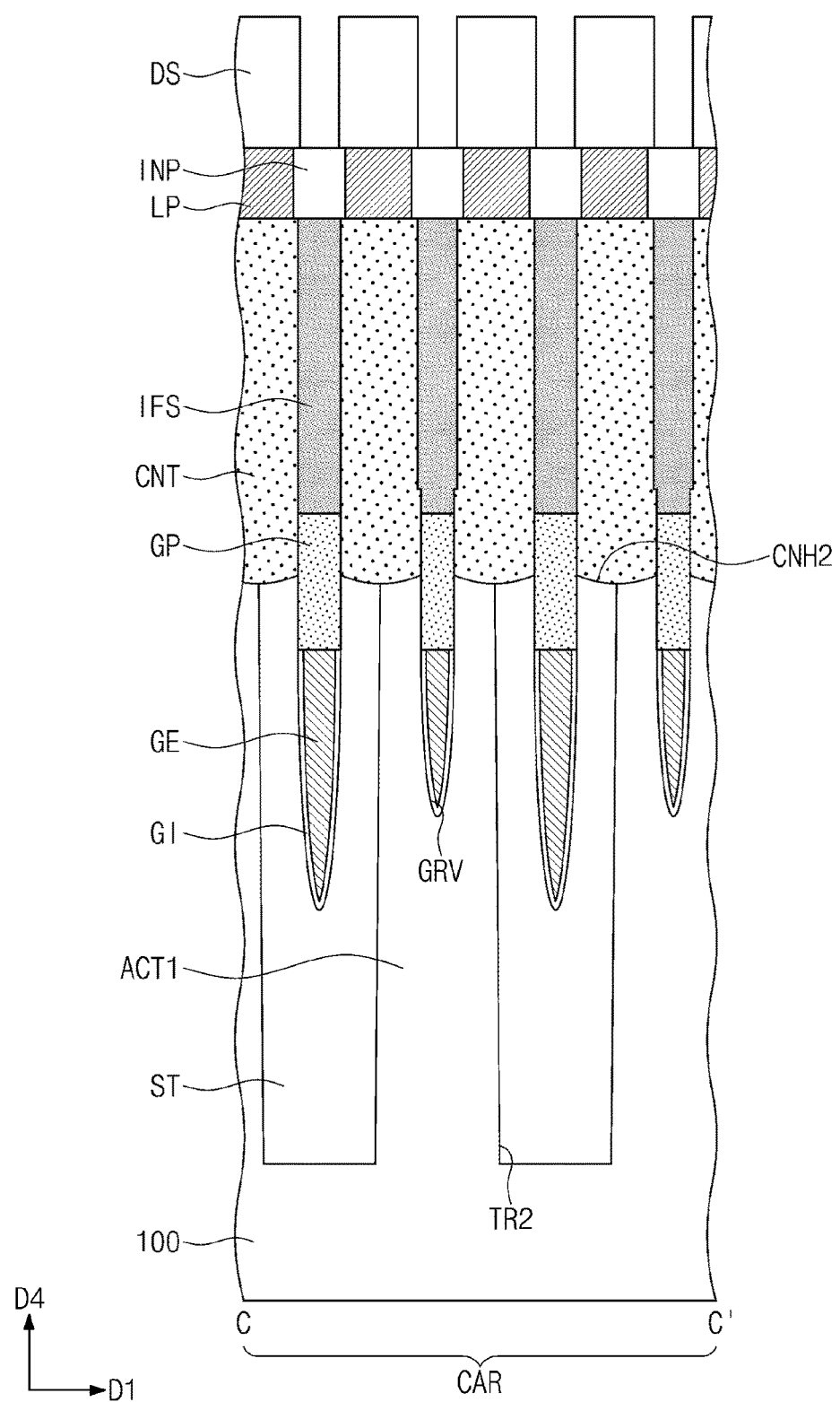
FIG. 3C is a cross-sectional view taken along line C-C' of FIG. 2.
Figure 3D:
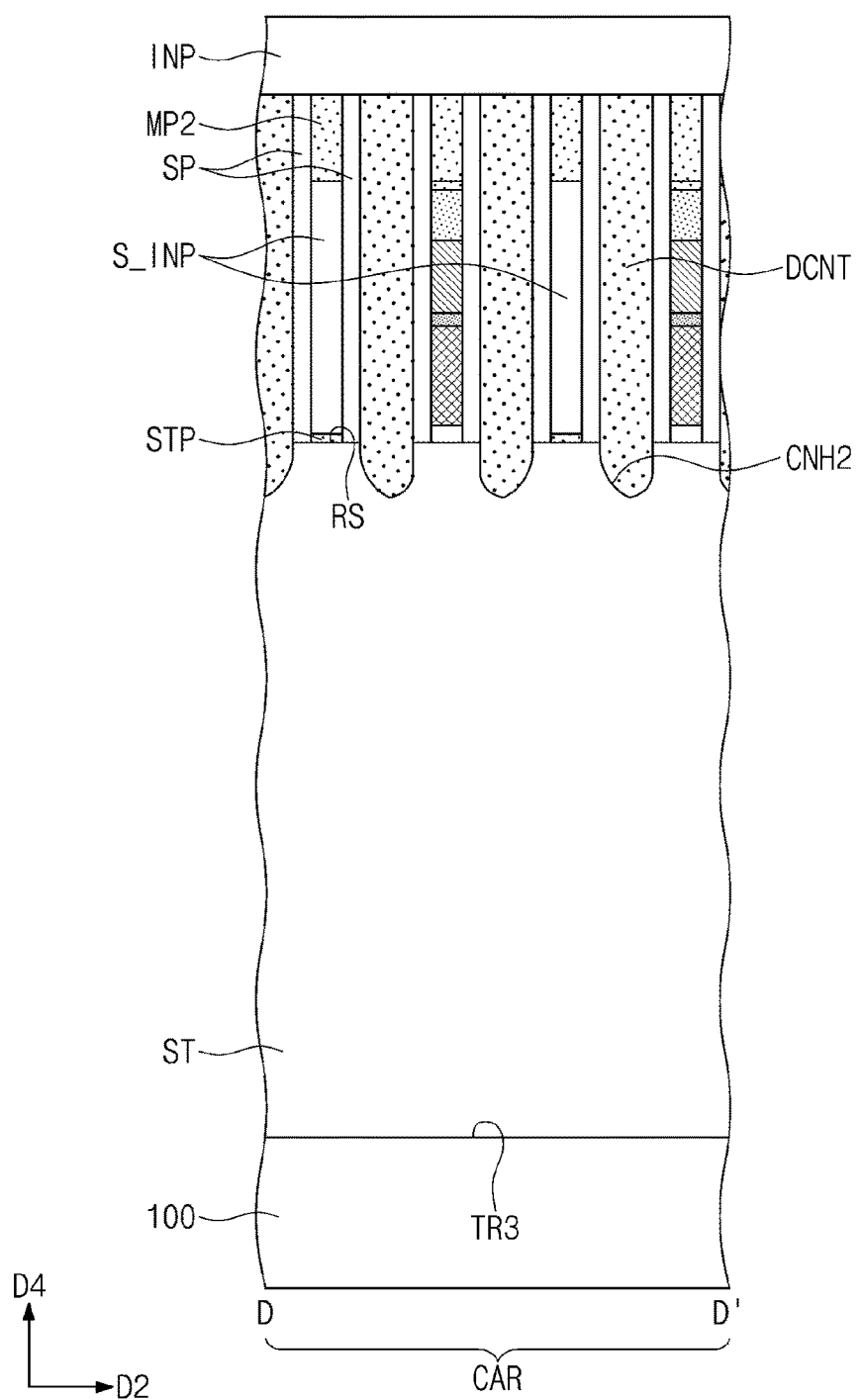
FIG. 3D is a cross-sectional view taken along line D-D' of FIG. 2.

FIG. 2 is an enlarged plan view of a boundary between a cell region and a core region of FIG. 1. FIG. 3A is a cross-sectional view taken along line A-A' of FIG. 2, FIG. 3B is a cross-sectional view taken along line B-B' of FIG. 2, and FIG. 3C is a cross-sectional view taken along line C-C' of FIG. 2, and FIG. 3D is a cross-sectional view taken along line D-D' of FIG. 2.

Referring to FIG. 2, a substrate 100 including a cell region CAR, a boundary region BR, and a core region COR may be provided. The cell region CAR may be a region in which a plurality of memory cells are provided. The boundary region BR may be interposed between the cell region CAR and a core region COR. The boundary region BR may be a region for buffering a process difference depending on a difference between a structure on the cell region CAR and a structure on the core region COR. The boundary region BR may connect the structure on the cell region CAR and the structure on the core region COR to each other.

The substrate 100 may be a bulk silicon substrate, silicon-on-insulator (SOI) substrate, germanium substrate, germanium-on-insulator (GOI) substrate, silicon-germanium substrate, or a substrate of an epitaxial thin layer obtained by performing selective epitaxial growth (SEG).

Hereinafter, the cell region CAR will be described in detail with reference to FIGS. 2 and 3A to 3D. A device isolation layer ST defining a first active patterns ACT1 may be provided on the cell region CAR of the substrate 100. The first active patterns ACT1 may be formed by patterning an upper portion of the substrate 100. Each of the first active patterns ACT1 may extend in a third direction D3 parallel to a top surface of the substrate 100. That is, each of the first active patterns ACT1 may have a long axis in the third direction D3. The first active patterns ACT1 may be two-dimensionally arranged in a first direction D1 and a second direction D2. The first active patterns ACT1 may be spaced apart from each other in the third direction D3.

Each of the first active patterns ACT1 may decrease in width in a direction perpendicular to the top surface of the substrate 100 (i.e., the fourth direction D4). That is, the width of each of the first active patterns ACT1 may decrease as a distance from a bottom surface of the substrate 100 increases.

First and second trenches TR1 and TR2 may be defined between the first active patterns ACT1. The device isolation layer ST may fill the first and second trenches TR1 and TR2 between the first active patterns ACT1. The first trench TR1 may be defined between a pair of first active patterns ACT1 adjacent to each other in the second direction D2. The second trench TR2 may be defined between a pair of first active patterns ACT1 adjacent to each other in the third direction D3.

A distance between a pair of first active patterns ACT1 adjacent to each other in the second direction D2 may be smaller than a distance between a pair of first active patterns ACT1 adjacent to each other in the third direction D3. Accordingly, the second trench TR2 may be deeper than the first trench TR1. That is, a bottom of the second trench TR2 may be lower than a bottom of the first trench TR1 (refer to FIG. 3B).

An upper portion of each of the first active patterns ACT1 may include a first source/drain region SD1 and a pair of second source/drain regions SD2. The first source/drain region SD1 may be positioned between the pair of second source/drain regions SD2. That is, in a plan view, the second source/drain region SD2, the first source/drain region SD1, and the second source/drain region SD2 may be sequentially arranged in the third direction D3.

A pair of grooves GRV may be defined in each of the first active patterns ACT1 (refer to FIG. 3C). Each of the grooves GRV may be defined between the first source/drain region SD1 and the second source/drain region SD2. The groove GRV may extend downward from the top surface of the first active pattern ACT1 toward the bottom surface of the substrate 100 while passing through the upper portion of the first active pattern ACT1. A bottom of the groove GRV may be higher than the bottoms of the first and second trenches TR1 and TR2.

An upper portion of each of the first active patterns ACT1 may further include a pair of channel regions CH. In a plan view, the channel region CH may be interposed between the first source/drain region SD1 and the second source/drain region SD2. The channel region CH may be positioned under the groove GRV (refer to FIG. 3C). Accordingly, the channel region CH may be positioned lower than the first and second source/drain regions SD1 and SD2.

Gate electrodes GE crossing the first active patterns ACT1 and the device isolation layer ST may be provided. The gate electrodes GE may be respectively provided in the grooves GRV. The gate electrodes GE may extend parallel to one another in the second direction D2. A pair of gate electrodes GE may be provided on a pair of channel regions CH of the first active pattern ACT1. That is, in a plan view, the gate electrode GE may be interposed between the first source/drain region SD1 and the second source/drain region SD2. A top surface of the gate electrode GE may be lower than the top surface of the first active pattern ACT1 (e.g., a top surface of the first source/drain region SD1 or a top surface of the second source/drain region SD2).

Referring back to FIG. 3A, an upper portion of the gate electrode GE may be adjacent to the first source/drain region SD1 of the first active pattern ACT1. A lower portion of the gate electrode GE may be adjacent to the channel region CH. The gate electrode GE may correspond to a word line of a memory cell.

Referring to FIGS. 2 and 3A to 3D, a gate dielectric layer GI may be interposed between the gate electrode GE and the first active pattern ACT1. A gate capping layer GP may be provided on the gate electrode GE. The gate capping layer GP may cover or overlap a top surface of the gate electrode GE. A top surface of the gate capping layer GP may be coplanar with the top surface of the first active pattern ACT1.

The gate electrode GE may include a conductive metal nitride (e.g., titanium nitride or tantalum nitride) and/or a metal material (e.g., titanium, tantalum, tungsten, copper, or aluminum). The gate dielectric layer GI may include a silicon oxide layer, a silicon nitride layer, a silicon oxynitride layer, and/or a high-k material. For example, the high-k material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may include a silicon oxide layer, a silicon nitride layer, and/or a silicon oxynitride layer.

A buffer layer IL may be provided on the substrate 100. The buffer layer IL may include first contact holes CNH1 exposing the first source/drain regions SD1 of the first active patterns ACT1. In some embodiments of the inventive concept, the buffer layer IL may include a first insulating layer and a second insulating layer that are sequentially stacked. The second insulating layer may have a higher dielectric constant than that of the first insulating layer. For example, the first insulating layer may include a silicon oxide layer, and the second insulating layer may include a silicon oxynitride layer.

Line structures LST extending parallel to one another in the first direction D1 may be provided on the buffer layer IL. The line structures LST may be arranged along the second direction D2. In a plan view, the line structures LST may vertically cross the gate electrodes GE (refer to FIG. 2). A pair of spacers SP may be provided on both sidewalls of each of the line structures LST. The spacers SP may include a silicon oxide layer, a silicon nitride layer, and/or a silicon oxynitride layer. Referring to FIG. 2, a pair of spacers SP may include spacers SP2 on the boundary region BR.

In some embodiments of the inventive concept, each of the spacers SP may include a first spacer, a second spacer, and a third spacer. The first spacer may directly cover or overlap a sidewall of the line structure LST. The second spacer may be interposed between the first spacer and the third spacer. The second spacer may be formed of an insulating material having a lower dielectric constant than that of the first and third spacers. For example, each of the first and third spacers may include a silicon nitride layer, and the second spacer may include a silicon oxide layer. As another example, the second spacer may be formed of air, that is, an air spacer.

Each of the line structures LST may include a conductive pattern CP, a barrier pattern BP, a bit line BL, and a mask pattern MP that are sequentially stacked. The conductive pattern CP may include a contact portion CNP that fills the first contact hole CNH1 and may be connected to the first source/drain region SD1. More specifically, the contact portion CNP may extend toward the bottom surface of the substrate 100 through the buffer layer IL. The contact portion CNP may be in contact with the first source/drain region SD1, directly.

The barrier pattern BP may suppress diffusion of a metal material in the bit line BL into the conductive pattern CP. The bit line BL may be electrically connected to the first source/drain region SD1 through the barrier pattern BP and the conductive pattern CP.

The conductive pattern CP may include a doped semiconductor material (doped silicon, doped germanium, etc.). The barrier pattern BP may include a conductive metal nitride (e.g., titanium nitride or tantalum nitride). The bit line BL may include a metal material (e.g., titanium, tantalum, tungsten, copper, or aluminum).

The mask pattern MP may include a first mask pattern MP1, a stopper pattern STP, and a second mask pattern MP2 sequentially stacked on the bit line BL. The stopper pattern STP may be interposed between the first and second mask patterns MP1 and MP2. Each of the first mask pattern MP1, the stopper pattern STP, and the second mask pattern MP2 may include silicon nitride or silicon oxynitride. For example, the first mask pattern MP1, the stopper pattern STP, and the second mask pattern MP2 may include the same material (e.g., silicon nitride).

Referring back to FIG. 3B, a plurality of insulating fences IFS may be provided on the gate capping layer GP. Each of the insulating fences IFS may extend through the buffer layer IL into an upper portion of the gate capping layer GP.

Referring back to FIGS. 2 and 3B, the insulating fences IFS may be two-dimensionally arranged in the first direction D1 and the second direction D2. In detail, the insulating fences IFS may be arranged in the second direction D2 on the gate capping layer GP extending in the second direction D2. The insulating fences IFS and the line structures LST may be alternately arranged in the second direction D2. The insulating fences IFS arranged in the second direction D2 may vertically overlap the gate electrode GE which is disposed under the insulating fences IFS.

Referring to FIGS. 2 and 3A to 3D, contacts CNT that pass through the buffer layer IL and are respectively connected to the second source/drain regions SD2 may be provided. Each of the contacts CNT may fill a second contact hole CNH2 formed by partially etching an upper portion of the second source/drain region SD2. Referring back to FIG. 3A, the contact CNT may be in contact with the second source/drain region SD2 exposed by the second contact hole CNH2, directly. Additionally, the contact CNT may be in contact with a sidewall of the spacer SP and the top surface of the device isolation layer ST. The contact CNT may be spaced apart from the line structure LST adjacent thereto by the spacer SP. Each of the contacts CNT may include a doped semiconductor material (doped silicon, doped germanium, etc.). Referring to FIG. 2, contacts CNT may include dummy contact DCNT on the boundary region BR.

Referring back to FIG. 2, the contacts CNT may be two-dimensionally arranged in the first direction D1 and the second direction D2. In detail, the contacts CNT and the line structures LST may be alternately arranged with one another in the second direction D2. The contacts CNT and insulating fences IFS may be interposed between adjacent line structures LST. The contacts CNT and the insulating fences IFS between the line structures LST adjacent to each other may be alternately arranged in the first direction D1.

Top surfaces of the contacts CNT may be coplanar with top surfaces of the second mask patterns MP2. Top surfaces of the contacts CNT may be coplanar with top surfaces of the spacers SP.

Landing pads LP respectively connected to the contacts CNT may be provided on the contacts CNT. The landing pads LP may be electrically connected to the second source/drain regions SD2 through the contacts CNT, respectively. The landing pad LP may be misaligned with the contact CNT connected thereto. That is, the landing pad LP may be horizontally offset from a center of the contact CNT connected thereto (refer to FIGS. 2 and 3A). The landing pads LP may include a metal material (e.g., titanium, tantalum, tungsten, copper, or aluminum).

Referring to FIG. 3A, abrasive particles AP may be interposed between the contacts CNT and the landing pads LP. The abrasive particles AP may be interposed between the second mask pattern MP2 and an insulating pattern INP on the core region COR. That is, the abrasive particles AP may be interposed between upper portions of the contacts CNT and lower portions of the landing pads LP. The abrasive particles AP may be interposed between an upper portion of the second mask pattern MP2 and a lower portion of the insulating pattern INP on the core region COR. The abrasive particles AP may be residues remaining after a chemical mechanical polishing (CMP) process that minimizes a step difference between the cell region CAR, the boundary region BR, and the core region COR.

The abrasive particles AP may have a spherical particle shape. A diameter of the abrasive particles AP may be smaller than a width of the contact CNT on the cell region CAR or a pattern feature width of the line structure. The abrasive particles AP may have a high selectivity for silicon compared to silicon nitride.

The abrasive particles AP may include a metal oxide, a metal oxide coated with an organic or inorganic material and in a colloidal state, carbon abrasive particles, or a combination thereof. The metal oxide may include, for example, silica, ceria, zirconia, alumina, titania, barium titania, germania, mangania, magnesia, or combinations thereof The carbon abrasive particles may be abrasive particles formed of or including carbon, for example, three-dimensional particles formed of carbon or including carbon as a main component. The carbon abrasive particles may include monomolecules or self-assembled aggregates of monomolecules. The self-assembled aggregates of carbon abrasive particles may be formed by self-alignment by surface properties of a plurality of carbon abrasive particles in a dispersion medium such as water, and may be, for example, vesicles or vesicle clusters. The carbon abrasive particles may include fullerene hydroxide represented by a spherical shell, for example, fullerene, hydrophilic fullerene, fullerene derivative, fullerene derivative, $C_x(OH)_y$ (where "x" may 60, 70, 74, 76 or 78, and "y" may be 12 to 44) or a combination thereof. A fullerene derivative may include a fullerene core formed of carbon and a plurality of functional groups bonded to the fullerene core.

The insulating pattern INP may be provided on the mask patterns MP. The insulating pattern INP on the cell region CAR may define a planar shape of the landing pads LP. The adjacent landing pads LP may be separated from each other by the insulating pattern INP.

Data storage elements DS may be provided respectively on the landing pads LP. Specifically, each of the data storage elements DS may be electrically connected to the second source/drain region SD2 through the landing pad LP and the contact CNT. According to some embodiments, each of the data storage elements DS may include a capacitor for storing data. For example, the data storage elements DS may include lower electrodes respectively connected to the landing pads LP, an upper electrode covering or overlapping the lower electrodes, and a dielectric layer interposed between the lower electrodes and the upper electrode. The upper electrode may be a common electrode that commonly covers or overlaps the lower electrodes.

Each of the lower electrodes may have a hollow cylinder shape. Each of the lower electrodes may include an impurity-doped silicon, a metal such as tungsten, or a conductive metal compound such as titanium nitride. The dielectric layer may include a high-k material such as, for example, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The upper electrode may include doped with silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or combinations thereof.

Hereinafter, the boundary region BR and the core region COR will be described in detail with reference to FIGS. 2, 3A, and 3D. A third trench TR3 may be defined between the cell region CAR and the core region COR of the substrate 100. That is, the third trench TR3 may be defined on the boundary region BR of the substrate 100. The device isolation layer ST may fill the third trench TR3.

At least one second active pattern ACT2 may be provided on the core region COR. For example, the third trench TR3 may be defined between the first active pattern ACT1 of the cell region CAR and the second active pattern ACT2 of the core region COR. Although the second active pattern ACT2 has a rectangular shape in FIG. 2, it is not limited thereto and may be changed into any shape.

A core gate structure CGS may be provided on the core region COR. The core gate structure CGS may include a core gate insulating layer CGI, a conductive pattern CP, a barrier pattern BP, a core gate electrode CGE, and a first mask pattern MP1, which are sequentially stacked on the second active pattern ACT2. For example, the core gate structure CGS and the second active pattern ACT2 may constitute a transistor of a sense amplifier in the core region COR.

Components of the core gate structure CGS may be formed in substantially the same process as components of the line structure LST on the cell region CAR described above. The components of the core gate structure CGS may be respectively disposed at substantially the same levels as the components of the line structure LST. That is, the core gate insulating layer CGI may correspond to the buffer layer IL, and the core gate electrode CGE may correspond to the bit line BL.

In some embodiments, one end of the core gate structure CGS may extend to the isolation layer ST of the boundary region BR. That is, at least a portion of the core gate structure CGS may vertically overlap the device isolation layer ST of the boundary region BR.

A sidewall spacer SPC may be provided on a sidewall of the core gate structure CGS. As shown in FIG. 3A, the sidewall spacer SPC may be positioned on the device isolation layer ST of the boundary region BR. The sidewall spacer SPC may include at least one of a silicon oxide layer, a silicon nitride layer, and a silicon oxynitride layer.

Referring to FIG. 2, the bit lines BL provided on the cell region CAR may extend in the first direction D1 and may be spaced apart from one another in the second direction D2. The bit lines BL may include first bit lines and second bit lines alternately arranged in the second direction D2. According to some embodiments, the first bit lines may be locally disposed on the cell region CAR of the substrate 100. The second bit lines may be disposed on the cell region CAR and may extend on the boundary region BR in the first direction.

Bit line pads BLPD may be disposed on the boundary region BR and may be spaced apart from one another in the second direction D2. The second bit lines may be respectively connected to the bit line pads BLPD. Each of the bit lines BL may have a first width in the second direction D2, and each of the bit line pads BLPD may have a second width in the second direction D2. The second width may be greater than the first width. Each of the bit line pads BLPD may have a structure corresponding to the line structures LST of FIG. 3A. That is, each of the bit line pads BLPD may include the conductive pattern CP, the barrier pattern BP, the bit line BL, and the mask pattern MP that are sequentially stacked.

Connection structures LCNT may be respectively disposed on the bit line pads BLPD. The connection structures LCNT may include a connection contact and a connection conductive line connected to each of the bit line pads BLPD. The connection conductive line may extend over the bit line pads BLPD and may be electrically connected to peripheral circuits on a peripheral region. The connection contact and the connection conductive line may include the same material as the landing pads LP. p Referring back to FIG. 2, an isolation insulating pattern S_INP may be provided on the boundary region BR and disposed between the bit line pads BLPD. According to some embodiments, a portion of the isolation insulating pattern S_INP may extend between the second bit lines on the boundary region BR and a dummy cell region. The isolation insulating pattern S_INP may include a first part disposed between the bit line pads BLPD on the boundary region BR and a second part disposed between the bit line pads BLPD on the dummy cell region. The second part of the isolation insulating pattern S_INP may extend in the first direction D1. The second part of the isolation insulating pattern S_INP may cover or overlap an end of the first bit line. The first part of the isolation insulating pattern S_INP may have a third width in the second direction D2, and the second part of the isolation insulating pattern S_INP may have a fourth width in the second direction D2. The third width may be greater than the fourth width. The fourth width may be substantially the same as the first width of the bit lines BL.

The isolation insulating pattern S_INP may include silicon oxide or silicon nitride. A part of the isolation insulating pattern S_INP may be replaced with a material having an etch selectivity different from that of the oxide layer. For example, the replacement material may be SiN. Also, the replacement material may be the same material as that of the second mask pattern MP2. The isolation insulating pattern S_INP may extend into the substrate 100 and the device isolation layer ST on the boundary region BR. Referring to FIG. 2, one end EN of the line structure LST may extend upward to the isolation layer ST of the boundary region BR. The isolation insulating pattern S_INP may be connected to the one end EN of the line structure LST. The isolation insulating pattern S_INP may be provided on the device isolation layer ST of the boundary region BR.

The stopper pattern STP may cover or overlap the one end EN of the line structure LST on the boundary region BR. The stopper pattern STP may cover or overlap the top surface of the device isolation layer ST of the boundary region BR from the line structure LST and extend onto the core gate structure CGS. The stopper pattern STP may cover or overlap the sidewall spacer SPC. The second mask pattern MP2 may be provided on the stopper pattern STP. The second mask pattern MP2 may extend from the line structure LST through the isolation insulating pattern S_INP onto the core gate structure CGS. In a plan view, the second mask pattern MP2 may overlap the line structure LST and the isolation insulating pattern S_INP. The second mask pattern MP2 on the core region COR may have a plate shape overlapping the core region COR. That is, the second mask pattern MP2 on the core region COR may cover or overlap not only the core gate structure CGS but also the isolation insulating pattern S_INP around the core gate structure CGS.

In some embodiments, as shown in FIG. 2, the second mask pattern MP2 may have a palm shape, in a plan view. Specifically, the second mask pattern MP2 on the cell region CAR and the boundary region BR may have a line shape extending in the first direction D1. The second mask pattern MP2 on the cell region CAR and the boundary region BR may overlap the line structure LST and the isolation insulating pattern S_INP. The second mask pattern MP2 on the core region COR may have a plate shape completely covering or overlapping the core region COR.

A recess region RS may be defined on an upper portion of the device isolation layer ST under the isolation insulating pattern S_INP. A bottom of the recess region RS of the device isolation layer ST may be lower than a top surface STt of the device isolation layer ST under the line structure LST. The bottom of the recess region RS of the device isolation layer ST may be lower than a top surface of the device isolation layer ST under the core gate structure CGS.

The isolation insulating pattern S_INP may be provided between one end of the core gate structure CGS of the core region COR and the one end EN of the line structure LST. The isolation insulating pattern S_INP may cap the one end EN of the line structure LST. That is, the isolation insulating pattern S_INP may prevent the bit line BL from being exposed to an oxide environment near the one end EN of the line structure LST.

The sidewall spacer SPC may be provided on the sidewall of the core gate structure CGS, but the spacer may be omitted on the one end EN of the line structure LST. The one end EN of the line structure LST may be directly covered or overlapped by the isolation insulating pattern S_INP. In detail, the isolation insulating pattern S_INP may directly cover or overlap the one end EN of the line structure LST. In detail, the one end EN of the line structure LST may be directly covered or overlapped by the stopper pattern STP. For example, the stopper pattern STP may include silicon nitride, and thus exposure of the one end EN of the bit line BL to the oxide environment may be prevented.

Referring back to FIGS. 2, 3A, and 3D, the insulating pattern INP may be provided on the second mask pattern MP2. Although not shown, at least one metal wiring may be provided in the insulating pattern INP. The metal wiring may electrically connect the bit line BL of the line structure LST and the core gate electrode CGE of the core gate structure CGS to each other. The insulating pattern INP may extend on the boundary region BR to fill a space between the connection structures LCNT. The insulating pattern INP may fill a space between the connection conductive lines of the connection structures LCNT.

Referring to FIGS. 2 and 3A, there may be a difference in height between a top surface of the contact CNT of the cell region CAR and a top surface of the second mask pattern MP2 of the boundary region BR according to some embodiments of the inventive concept. A height level LV1 of the top surface of the second mask pattern MP2 of the boundary region BR and a height level LV2 of the top surface of the contact CNT of the cell region CAR is referred to as a step difference. When a CMP process for minimizing the step difference between the cell region CAR, the boundary region BR, and the core region COR is performed, the step difference may be 0.1 nm to 5 nm.

When the step difference is minimized, the insulating pattern INP provided on the second mask pattern MP2 of the boundary region BR may have a uniform depth. The landing pads LP provided on the contact CNT of the cell region CAR may have a uniform depth. This is because a depth of the photo/etch mask is constant after the CMP process is performed. After performing the conventional CMP process, depths of the masks may be different for each region due to the step difference. When the heights of the masks are different, the amount of the remaining photoresist is different based on the same light energy applied during an exposure process. In this case, a target critical dimension (CD) value during the photo/etch process may be different. That is, a phenomenon in which CD distribution is non-uniform may occur. Also, the mask may be a flowable mask or a chemical vapor deposition (CVD) mask. In this case, the flowable mask may flow due to the step difference, instead of being fixed. Accordingly, the target critical dimension (CD) value during the photo/etch process may vary. That is, the phenomenon in which the CD distribution is non-uniform may occur. When the CMP process for minimizing the step difference between the cell region CAR, the boundary region BR, and the core region COR according to the inventive concept is performed, the CD distribution may be prevented from being non-uniform.

When the step difference is minimized, efficiency may be improved in a circuit electrode forming process performed on the core region COR. An etch process may be performed through an etch gas or an etch chemical. Energy values of the etch gas or the like in the etch process may be the same. In this case, when the step difference is minimized, a target penetration distance in the etch process may be constant. That is, the non-uniform distribution of the depth of the layer after the etching process may be improved. A height and path length of the layer through which an electrical signal is transmitted may be constant, and thus timing of the electrical signal in a wafer chip may be constant. Accordingly, phenomenon of occurrence of defects such as electrode bridge and contact resistance due to electrode dispersion may be improved. That is, a defect in a column may be improved. When the CMP process for minimizing the step difference between the cell region CAR, the boundary region BR, and the core region COR according to the inventive concept is performed, a highly integrated semiconductor device may be efficiently manufactured. As a result, the semiconductor device according to the inventive concept may have improved reliability and yield.

Figure 4:
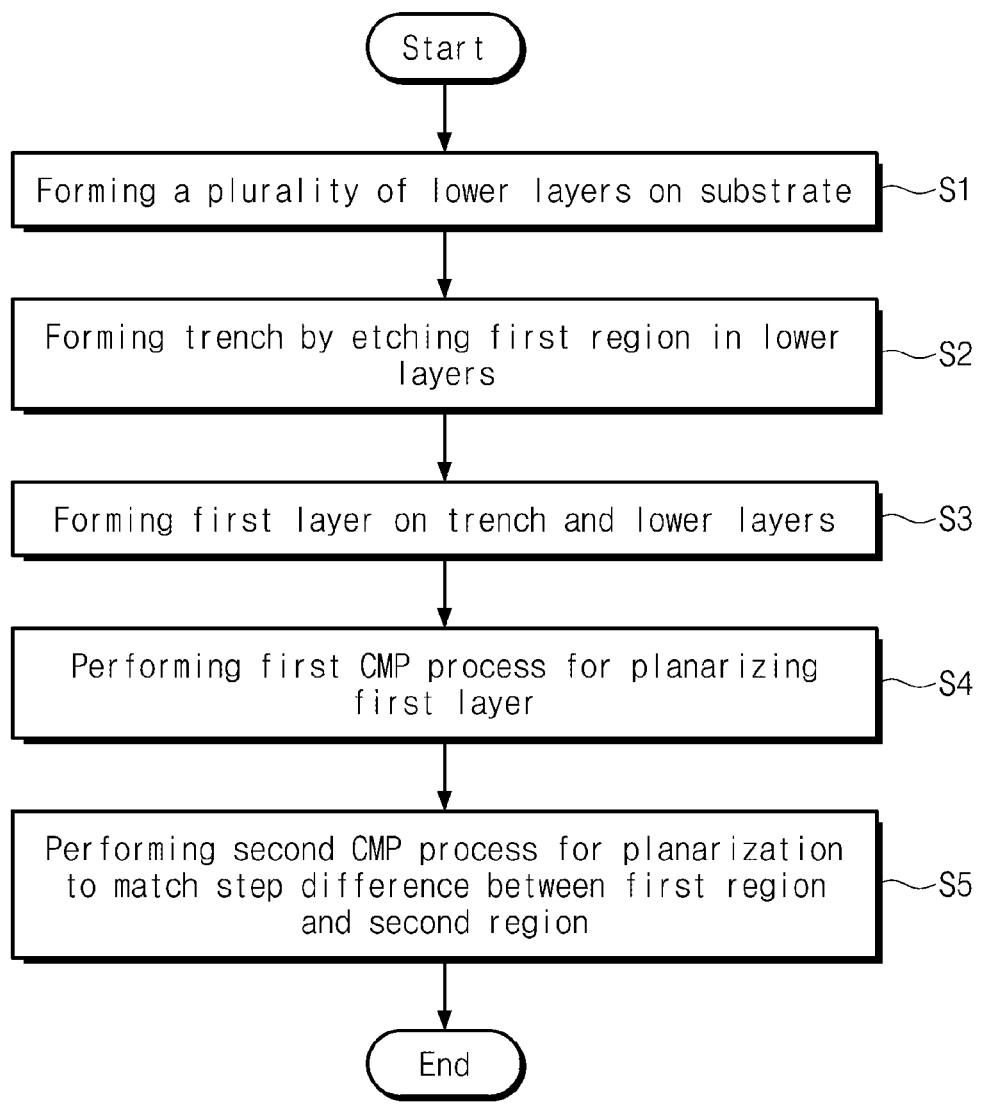
FIG. 4 is a flowchart illustrating a CMP process for minimizing a step difference between a cell region, a boundary region, and a core region, which is a semiconductor device manufacturing method.

FIG. 4 is a flowchart illustrating a CMP process for minimizing a step difference between a cell region, a boundary region, and a core region, which is a semiconductor device manufacturing method, and FIGS. 5A to 5F are cross-sectional views illustrating a method of manufacturing a semiconductor device of FIG. 4.

Referring to FIG. 4, a method of manufacturing a semiconductor device according to the inventive concept may include a CMP process for minimizing a step difference between a cell region, a boundary region, a core region. The method of manufacturing the semiconductor device may include forming a plurality of lower layers on a substrate in S1, forming a trench by etching a first region in the lower layers in S2, forming a first layer on the trench and the lower layers in S3, performing a first CMP process for planarizing the first layer in S4, and performing a second CMP process for planarization to match a step difference between the first region and a second region in S5.

Figure 5A:
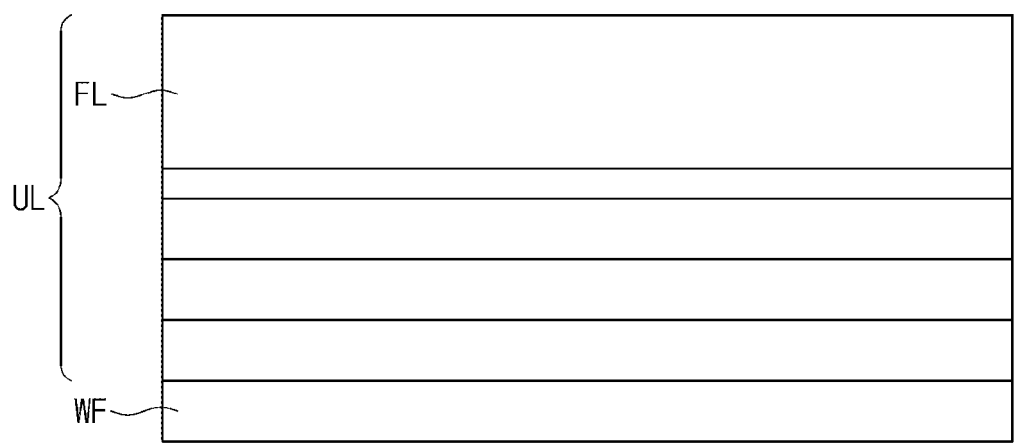
FIGS. 5A to 5F are cross-sectional views illustrating a CMP process of FIG. 4.

Referring to FIGS. 4 and 5A, the forming of the plurality of lower layers on the substrate in S1 is forming a plurality of lower layers UL on a substrate WF. The substrate WF may correspond to or the same as the substrate 100 of FIG. 2. The lower layers UL may correspond to the layers of the line structure LST on the cell region CAR of FIG. 3A, the layers of the line structure LST on the boundary region BR, or the second mask pattern MP2 on the boundary region BR of FIG. 3A. The lower layers UL may be deposited through a CVD, PVD, or ALD process. A second layer FL provided on the uppermost of the lower layers UL may correspond to the second mask pattern MP2 of the line structure LST on the cell region CAR of FIG. 3A and the second mask pattern MP2 on the boundary region BR of FIG. 3A. The second layer FL may include silicon nitride.

Figure 5B:
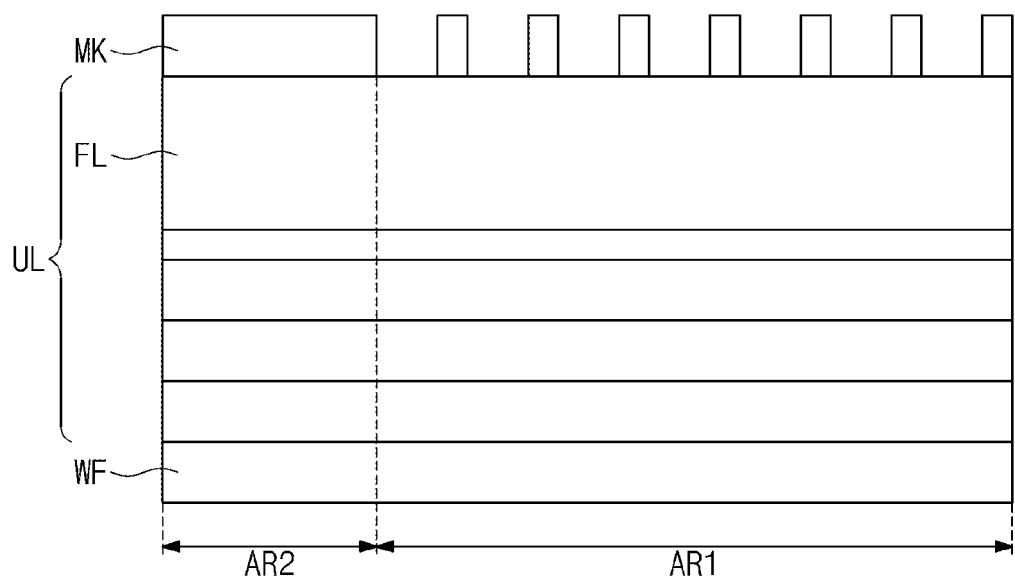
Figure 5C:
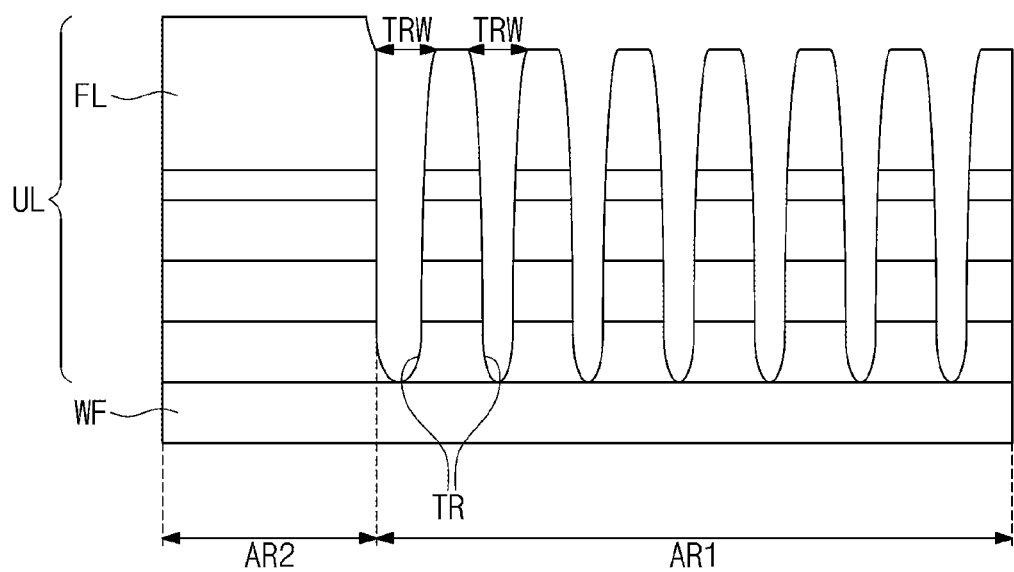

Referring to FIGS. 4, 5B and 5C, the forming of the trench by etching the first region in the lower layers in S2 is forming a trench TR in a first region AR1 in which a cell pattern is to be formed in the substrate WF. Referring to FIG. 5B, a photo process may be performed. After a mask MK is formed on the first layer FL, exposure may be performed. After the exposure is performed, the mask MK on an area where the trench TR is formed in the first region AR1 may be removed through development. Referring to FIG. 5C, an etch process may be performed. When the photo/etch process is performed, the trench TR in the first region AR1 may be formed.

Figure 5D:
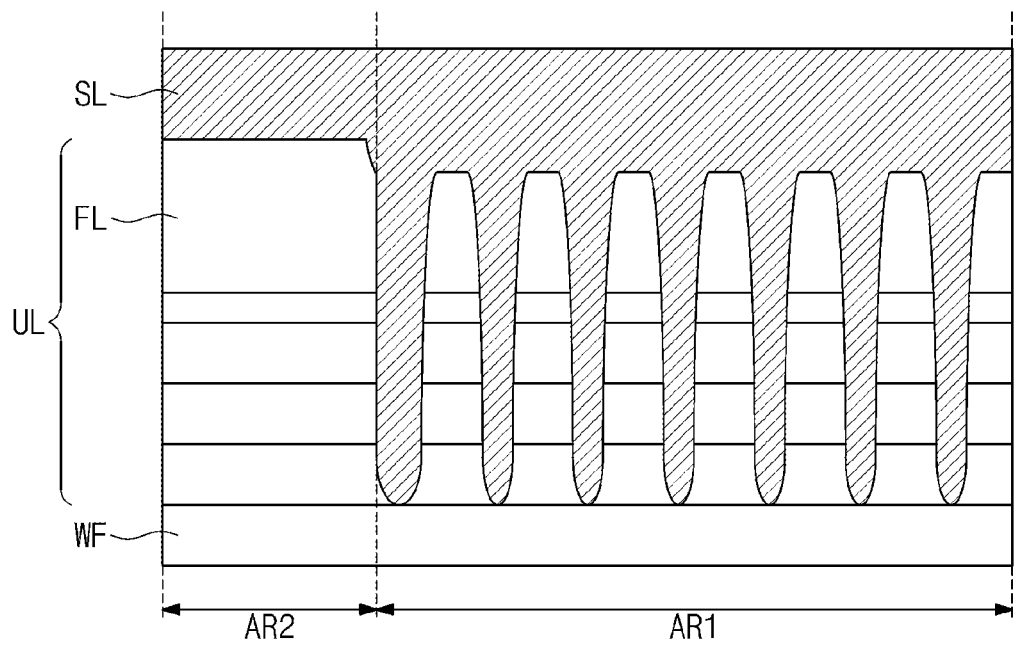

Referring to FIGS. 4 and 5D, the forming of the first layer on the trench and the lower layers in S3 is forming a first layer SL to cover or overlap side surfaces, lower surfaces of the trench, and a top surface of the second layer FL in the first region AR1, and a top surface of the second layer FL in the second region AR2. The first layer SL may correspond to the contact CNT on the cell region CAR of FIG. 3A. The first layer SL may be deposited through a CVD, PVD, or ALD process. The first layer SL may include a doped semiconductor material (doped silicon, doped germanium, etc.) or a polysilicon material. The first layer SL may be a bulk silicon layer.

Figure 5E:
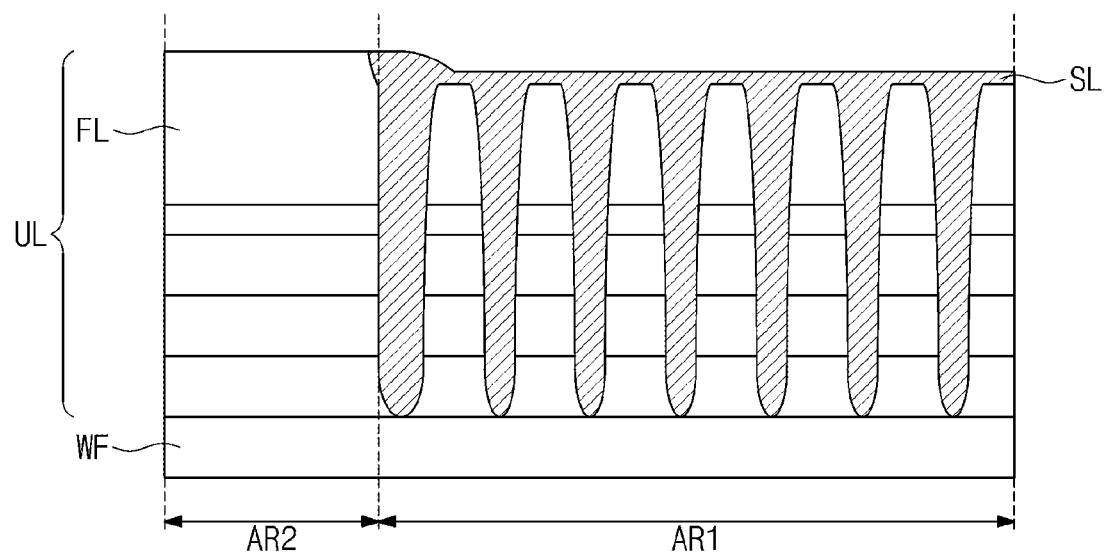

Referring to FIGS. 4 and 5E, the performing of the first CMP process for planarizing the first layer in S4 is removing a target value by using a first slurry for removing a bulk layer of the first layer SL. The first slurry may include abrasive particles, additives, oxidizing agents, dispersing agents, and pH adjusting agents. An end point detection (EPD) method may be used to match the target value. In addition, the CMP process may be performed by setting an estimated target value based on a depth at which the first layer SL is formed. When the EPD method is used, as the second layer FL of the second region AR2 is exposed, a signal based on the layer may be changed. Accordingly, the first CMP process may be terminated. When the first CMP process is performed, dishing or erosion may occur. Accordingly, a top surface of the first layer SL filling the trench near the boundary between the first region AR1 and the second region AR2 may be higher than a top surface of the first layer SL filling the other trenches. A height of the top surface of the first layer SL filling the trench near the boundary between the first region AR1 and the second region AR2 may be the same as a height of the top surface of the second layer FL on the second region AR2.

Figure 5F:
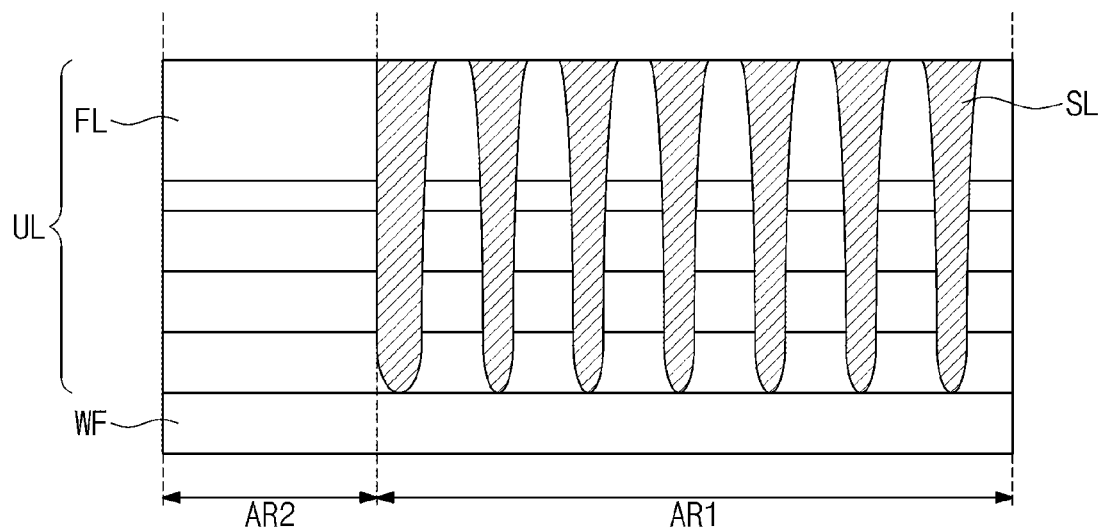

Referring to FIGS. 4 and 5F, the performing of the second CMP process for planarizing to match the step difference between the first and second regions in S5 is planarizing the second region AR2 and self-stopping of the second CMP process as the second layer FL of the first region AR1 is exposed. A second slurry used in the second CMP process may have an opposite selectivity of a layer with respect to the first slurry. For example, the first slurry may have a high selectivity for silicon nitride compared to silicon, and the second slurry may have a high selectivity for silicon compared to silicon nitride. That is, when CMP is performed using the first slurry, the amount of removing the silicon layer is greater than the amount of removing the silicon nitride layer. In addition, when CMP performed using the second slurry, the amount of removing the silicon nitride layer is greater than the amount of removing the silicon layer. The second slurry may include abrasive particles, additives, oxidizing agents, dispersing agents, and pH adjusting agents. The abrasive particles of the second slurry may correspond to or be the same as the abrasive particles AP of FIG. 3A.

The abrasive particles of the second slurry may have a spherical shape. A diameter of the abrasive particles of the second slurry may be smaller than a pitch of cell patterns formed in the first region AR1. The pitch of the cell pattern may be a width TRW of an upper portion of the trench TR of FIG. 5C, and may be an interval between the trenches. In addition, the pitch of the cell pattern may correspond to or be the same as the width of the contact CNT on the cell region CAR of FIG. 3A or the pattern feature width of the line structure.

Figure 6:
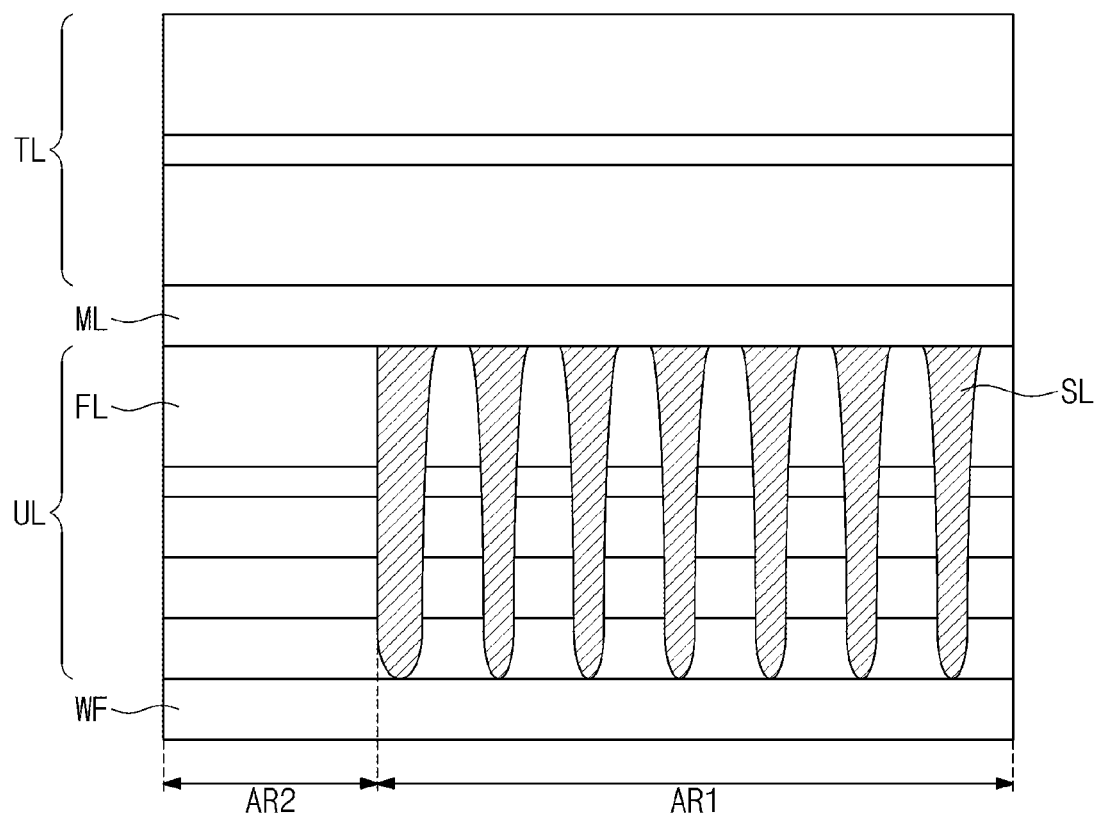
Figure 7:
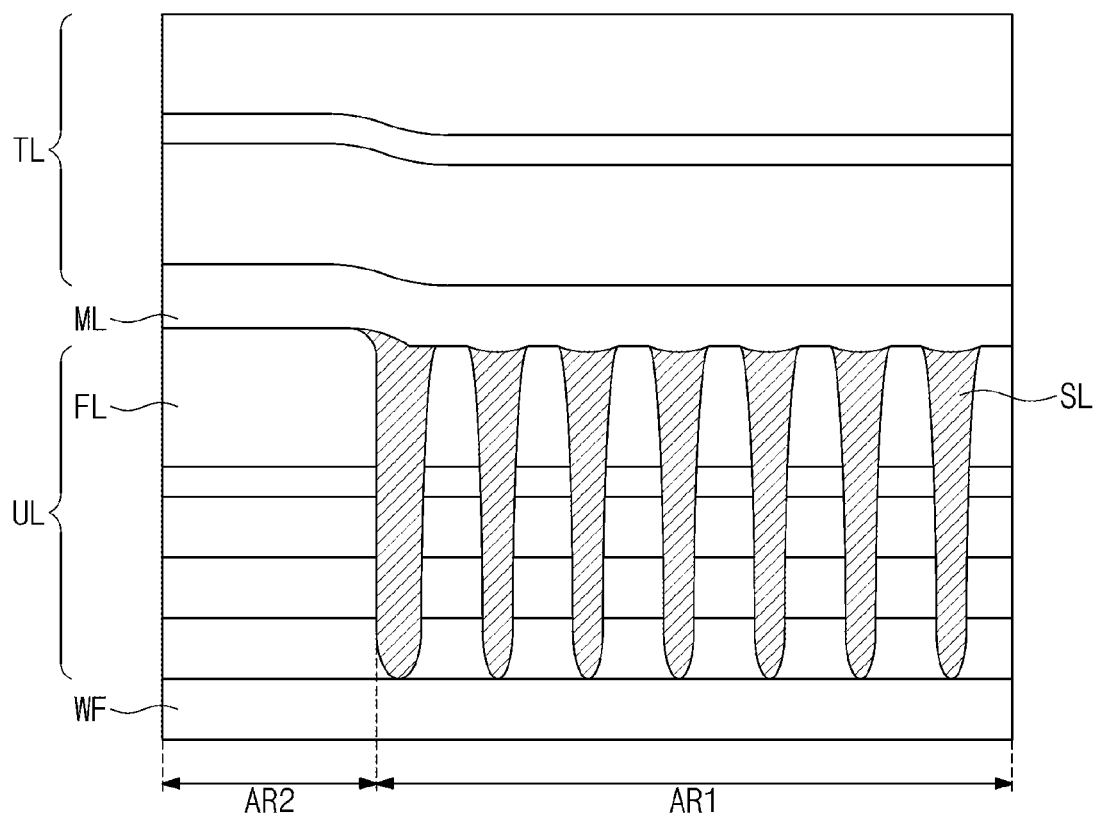
FIG. 7 is a cross-sectional view of a structure to which a general CMP process is applied.

Referring to 6 and 7, FIG. 6 is a cross-sectional view of a structure to which FIG. 4 is applied, and FIG. 7 is a cross-sectional view of a structure to which a general CMP process is applied. FIG. 6 is a structure in which a step difference between a first region and a second region is minimized according to some embodiments of the inventive concept, and FIG. 7 is a structure in which a step difference between a first region and a second region according to a general CMP exist. Referring to FIGS. 6 to 11, in performing the second CMP process for planarization to match the step difference between the first region and the second region, it may be seen that a principle of self-stopping the second CMP process as the second layer FL of the first region AR1 is exposed. In addition, it is possible to compare the structure to which FIG. 4 is applied and the structure to which it is not applied.

Figure 8:
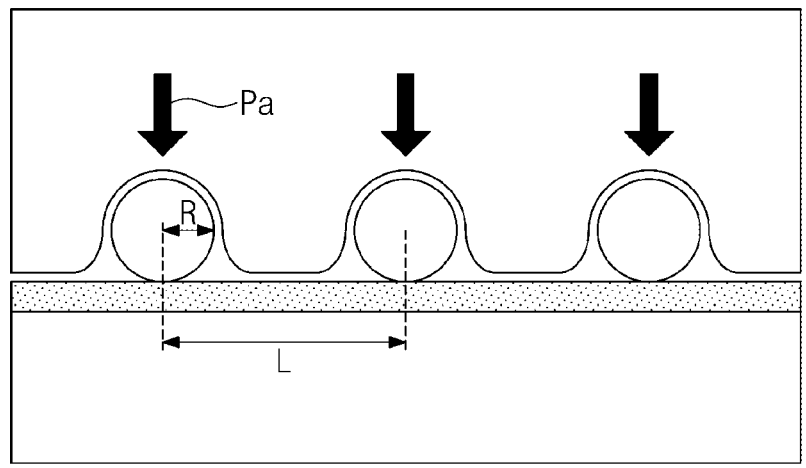
FIGS. 8 to 11 are diagrams showing principles of the inventive concept.

Referring to FIG. 8, when a pad of a CMP equipment applies pressure to the abrasive particles of the slurry, a contact pressure $P_c$ may be seen. The contact pressure $P_c$ is proportional to a square of a radius "$R_p$" of the abrasive particles, and is inversely proportional to a square of a spacing "$\lambda_p$" between the abrasive particles. A characteristics value of the contact pressure $P_c$ may be derived based on Equation 1 below. The total pad pressure $P_a$ may be greater than the contact pressure $P_c$ or may be equal to the contact pressure $P_c$. The hardness constant $H_a$ refers to a constant value related to the hardness of the pad.

$$p_a \geq p_c = \pi H_a \frac{R_p^2}{\lambda_p^2} \quad \text{[Equation 1]}$$

Figure 9:
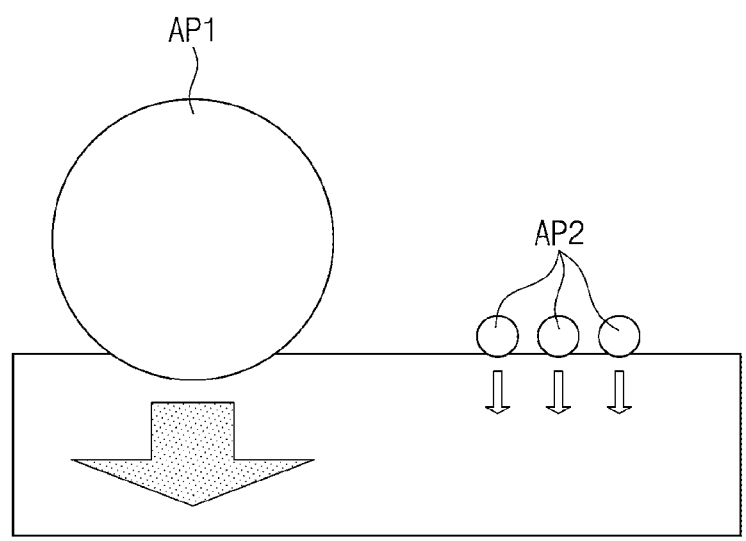

Referring to FIG. 9, even when sizes of the abrasive particles AP1 and AP2 are different for a single layer, selectivity of the slurry may be maintained. The selectivity may be a ratio of an amount to remove a certain layer when performing a CMP process using a slurry. The single layer may be formed of a material having the same properties. The single layer may not be affected by pattern density, the selectivity of the slurry may be maintained, and the CMP process may be performed without a phenomenon in which a part of the single layer is collapsed.

Figure 10:
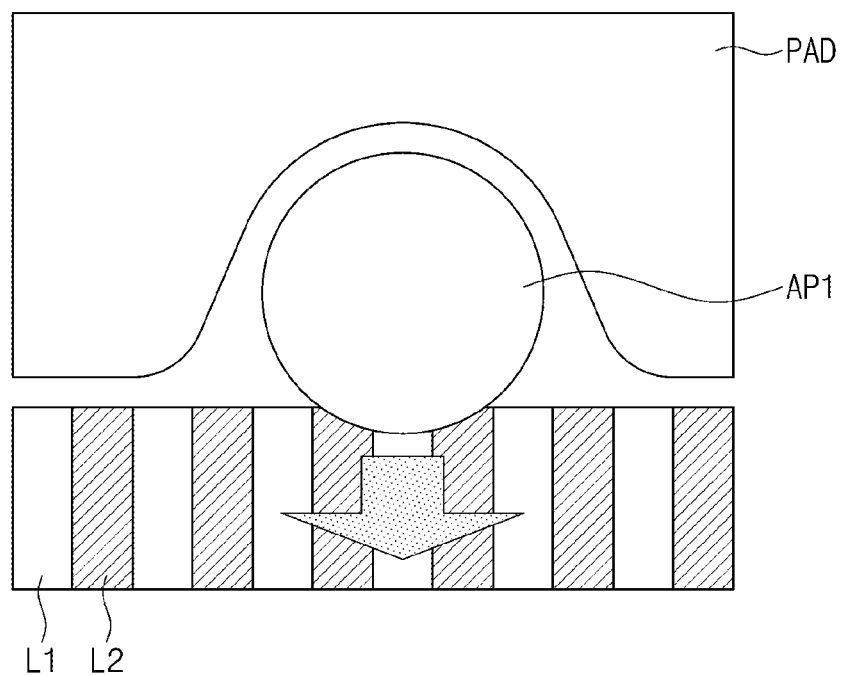
Figure 11:
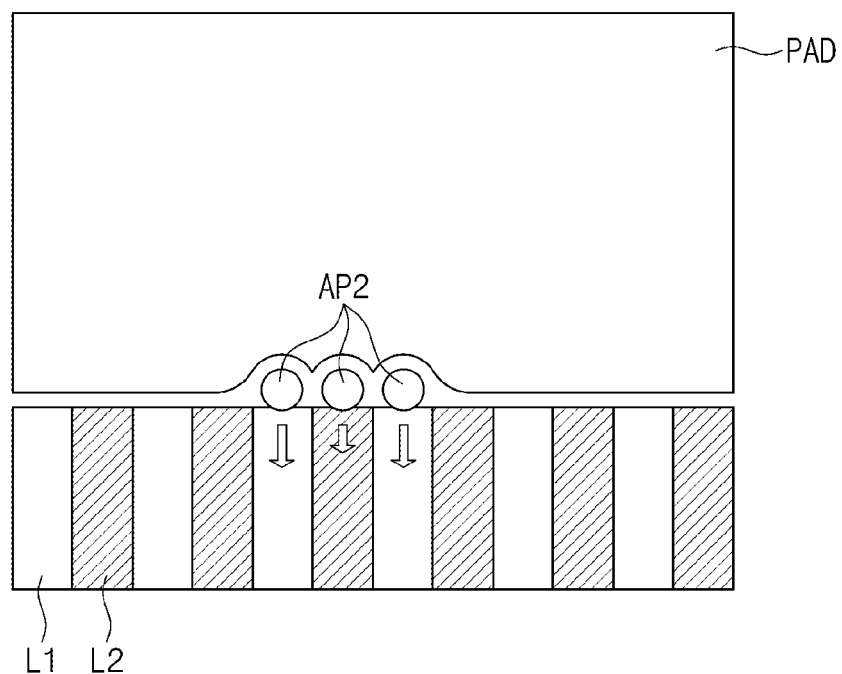

Referring to FIGS. 10 and 11, selectivity of a slurry may vary depending on sizes of abrasive particles AP1 and AP2 for a multi-layered layer. The selectivity may be a ratio of an amount to remove a certain layer when performing a CMP process using a slurry. Unlike the single layer, the multilayer layer may be provided by repeatedly providing two layers L1 and L2 having different properties. A manner in which the two layers L1 and L2 are repeated may be a multilayer pattern. A slurry including each of the abrasive particles AP1 and AP2 may have each selectivity for materials formed of layers. In this case, the selectivity may be changed depending on the sizes of the abrasive particles AP1 and AP2.

Referring to FIGS. 7 and 10, a diameter of the abrasive particle AP1 may be greater than a collective width of the two layers L1 and L2. In this case, when the CMP process is performed, a plurality of layers L1 and L2 may exist in a region which is in contact with the single abrasive particle AP1. A contact pressure may be applied to the abrasive particles AP1 by a pad of the CMP equipment. Accordingly, the multi-layered pattern may collapse due to the contact pressure. As the multi-layered pattern collapses, the CMP process may be performed. To this end, the CMP process may be performed without maintaining the selectivity of the slurry. Thereafter, the mask layer ML and upper layers TL may be formed on the first layer SL and the second layer FL. The mask layer ML may be a flowable mask or a CVD mask. The upper layers TL may be deposited through a CVD, PVD, or ALD process. A height difference exists between a top surface of the first layer SL in the first region AR1 and a top surface of the second layer FL in the second region AR2, which is referred to as a step difference. Problems due to the step difference, such as mask critical dimension (CD) dispersion and poor contact with a tungsten electrode, may occur in a subsequent process.

Referring to FIGS. 6 and 11, a diameter of the abrasive particle AP2 may be smaller than a width of the two layers L1 and L2. In this case, when the CMP process is performed, one layer L1 and L2 may each exist in a region which is in contact with the single abrasive particle AP2. A contact pressure may be applied to the abrasive particles AP2 by the pad of the CMP equipment. Referring to FIG. 8, as the size of the abrasive particles AP2 is smaller, the contact pressure may be lower, and thus the multi-layered pattern may not collapse. The CMP process may be performed while the multi-layered pattern is maintained. To this end, the CMP process may be performed while the selectivity of the slurry is maintained. For example, an amount by which a third layer L1 is removed is large, and an amount by which the fourth layer L2 is removed is less than an amount by which the third layer L1 is removed based on the selectivity of the abrasive particles AP2. Thereafter, a mask layer ML and upper layers TL may be formed on the first layer SL and the second layer FL. The mask layer ML may be a flowable mask or a CVD mask. The upper layers TL may be deposited through a CVD, PVD, or ALD process. As the CMP process is performed using the slurry including the abrasive particles AP2, the step difference between the first region AR1 and the second region AR2 may be minimized.

As the step difference is minimized, the mask distribution and the flow of the mask for photo/etch may be improved in subsequent integration. Accordingly, the CD dispersion may be improved. In addition, a penetration distance of the etching process may be constant in a circuit electrode forming process of the core region COR of FIG. 2, and thus an etch process height dispersion may be improved. Accordingly, a timing of the electrical signal in a wafer chip may be constant, and defects such as electrode bridges and contact resistance caused by electrode dispersion may be improved. That is, a defect in a column may be improved. Accordingly, it is possible to efficiently manufacture a highly integrated semiconductor device. As a result, reliability and yield of the semiconductor device according to the manufacturing method of the inventive concept may be improved.

According to the semiconductor device of the inventive concept, the abrasive particles having the diameter smaller than the width of the contact and the pattern feature width of the line structure on the cell region may be used. The diameter of the abrasive particle may be smaller than the width of the contact and the pattern feature width of the line structure on the cell region, and thus the intrinsic selectivity for the material formed of the layer may maintained. Accordingly, the CMP process that minimizes the step difference between the core region, the peripheral region, and the cell region may be performed.

The step difference between the core region, the peripheral region, and the cell region may be minimized, and thus the mask distribution for photo/etch may be improved in subsequent integration. Accordingly, the CD dispersion may be improved. In addition, the penetration distance of the etching process may become constant in the circuit electrode forming process of the core region, and thus the etch process height dispersion may be improved. Accordingly, the timing of the electrical signal in the wafer chip may be constant, and the defects, such as the electrode bridge and the contact resistance caused by the electrode dispersion, may be improved. That is, the defect in the column may be improved. As a result, the semiconductor device according to the inventive concept may have the improved reliability and yield.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
   a substrate comprising a first active pattern of a cell region, wherein the first active pattern has a long axis in a first direction, and wherein the first active pattern comprises a first source/drain region and a second source/drain region spaced apart from each other in the first direction;
   a device isolation layer on the cell region, the device isolation layer in a trench defining the first active pattern;
   a buffer layer on the cell region;
   a line structure that extends through the first active pattern in a third direction crossing a second direction and the first direction on the buffer layer, wherein the line structure extends from the cell region to a boundary region, and wherein the line structure comprises a first conductive pattern that passes through the buffer layer and contacts the first source/drain region, a bit line on the first conductive pattern, and a first barrier pattern between the bit line and the first conductive pattern;
   spacers on respective sidewalls of the line structure;
   a contact on the second source/drain region;
   a landing pad on the contact;
   a first abrasive particle between the contact and the landing pad; and
   a data storage element on the landing pad.

2. The semiconductor device of claim 1, wherein the first abrasive particle has a particle diameter which is less than a width of the contact or less than a width of the line structure in the second direction.

3. The semiconductor device of claim 1,
   wherein the first abrasive particle has a high etch selectivity for removing silicon nitride compared to silicon,
   wherein the contact comprises silicon, and
   wherein a first mask pattern of the line structure comprises silicon nitride.

4. The semiconductor device of claim 1, further comprising:
   a gate electrode in a groove between the first and second source/drain regions of the first active pattern, wherein the gate electrode extends in the second direction;
   a gate dielectric layer between the gate electrode and the first active pattern; and
   a gate capping layer on the gate electrode and in the groove.

5. The semiconductor device of claim 1, wherein the data storage element comprises a capacitor.

6. The semiconductor device of claim 1, further comprising:
a second active pattern in a core region of the substrate;
a core gate structure on the second active pattern;
a second mask pattern on the core gate structure;
an insulating pattern on the second mask pattern; and
a second abrasive particle between the second mask pattern and the insulating pattern.

7. The semiconductor device of claim 6, wherein the second abrasive particle has a particle diameter which is less than a width of the contact or less than a width of the line structure in the second direction.

8. The semiconductor device of claim 7,
wherein the second abrasive particle has a high etch selectivity for removing silicon nitride compared to silicon,
wherein the contact comprises silicon, and
wherein the second mask pattern comprises the silicon nitride.

9. The semiconductor device of claim 1, wherein the first abrasive particle comprises a metal oxide, a metal oxide coated with an organic or inorganic material and in a colloidal state, carbon abrasive particles, or a combination thereof.

10. A semiconductor device comprising:
a substrate comprising a cell region, a core region, and a boundary region between the cell region and the core region, wherein the cell region comprises a first active pattern, and wherein the core region comprises a second active pattern;
a device isolation layer on the boundary region, wherein the device isolation layer is in a trench between the first active pattern and the second active pattern;
a line structure on the first active pattern and extending from the cell region to the boundary region;
a core gate structure on the second active pattern;
a mask pattern on the core gate structure;
an insulating pattern on the mask pattern;
a first abrasive particle between the mask pattern and the insulating pattern; and
a contact on the first active pattern,
wherein a step difference between a top surface of the mask pattern on the core region and a top surface of the contact on the cell region is about 1 nm to 5 nm.

11. The semiconductor device of claim 10, wherein the first abrasive particle has a particle diameter which is less than a width of the contact of the first active pattern or less than a width of the line structure.

12. The semiconductor device of claim 11,
wherein the first abrasive particle has a high etch selectivity for removing silicon nitride compared to silicon,
wherein the contact comprises silicon, and
wherein the mask pattern comprises silicon nitride.

13. The semiconductor device of claim 10, wherein the first active pattern comprises a first source/drain region and a second source/drain region, the semiconductor device further comprising:
a gate electrode in a groove on an upper portion of the first active pattern, wherein the gate electrode is between the first source/drain region and the second source/drain region of the first active pattern,
wherein the contact is on the second source/drain region; and
a data storage element on the contact,
wherein the first source/drain region is electrically connected to the line structure.

14. The semiconductor device of claim 13, wherein the data storage element comprises a capacitor.

15. The semiconductor device of claim 13, further comprising:
a dummy contact on a side of the mask pattern.

16. The semiconductor device of claim 10,
wherein the line structure extends in a first direction,
wherein the mask pattern extends in the first direction, and
wherein the mask pattern is aligned with the line structure in the first direction.

17. A semiconductor device comprising:
a substrate comprising a cell region, a core region, and a boundary region between the cell region and the core region, wherein the cell region comprises a first active pattern, and wherein the core region comprises a second active pattern;
a buffer layer on the cell region;
a line structure on the buffer layer, wherein the line structure comprises a conductive pattern, a barrier pattern, and a bit line sequentially stacked on a first source/drain region;
spacers on respective sidewalls of the line structure;
a contact on a second source/drain region on the first active pattern;
a landing pad on the contact;
a data storage element on the landing pad;
a core gate structure on the second active pattern;
a mask pattern on the core gate structure; and
an insulating pattern on the mask pattern,
wherein a step difference between a top surface of the mask pattern on the core region and a top surface of the contact on the cell region is about 1 nm to 5 nm.

18. The semiconductor device of claim 17, further comprising:
a first abrasive particle between the contact and the landing pad; and
a second abrasive particle between the mask pattern and the insulating pattern.

19. The semiconductor device of claim 18, wherein the first abrasive particle and the second abrasive particle have a particle diameter which is less than a width of the contact on the first active pattern or less than a width of the line structure.

20. The semiconductor device of claim 18,
wherein the landing pad is misaligned with the contact in at least one direction,
wherein the first abrasive particle contacts both the landing pad and the contact.

* * * * *